United States Patent
Sofin

(10) Patent No.: US 9,534,290 B2
(45) Date of Patent: Jan. 3, 2017

(54) APPARATUS FOR DEPOSITION OF POLYCRYSTALLINE SILICON COMPRISING UNIFORMLY SPACED FILAMENT RODS AND GAS INLET ORIFICES, AND PROCESS FOR DEPOSITION OF POLYCRYSTALLINE SILICON USING SAME

(75) Inventor: Mikhail Sofin, Burghausen (DE)

(73) Assignee: WACKER CHEMIE AG, Munich (DE)

( * ) Notice: Subject to any disclaimer, the term of this patent is extended or adjusted under 35 U.S.C. 154(b) by 940 days.

(21) Appl. No.: 13/618,044

(22) Filed: Sep. 14, 2012

(65) Prior Publication Data

US 2013/0089488 A1 Apr. 11, 2013

(30) Foreign Application Priority Data

Oct. 7, 2011 (DE) .................. 10 2011 084 137

(51) Int. Cl.
   *C30B 25/08* (2006.01)
   *C23C 16/24* (2006.01)
   *C01B 33/035* (2006.01)

(52) U.S. Cl.
   CPC ............. *C23C 16/24* (2013.01); *C01B 33/035* (2013.01)

(58) Field of Classification Search
   CPC .......... C30B 25/00; C30B 25/02; C30B 25/12; C30B 25/14; C30B 25/08; Y10T 117/00; Y10T 117/10; C23C 16/24; C01B 33/035
   USPC .... 117/84, 88, 101, 102, 200, 911, 928, 935
   See application file for complete search history.

(56) References Cited

U.S. PATENT DOCUMENTS

| | | | |
|---|---|---|---|
| 3,011,877 A | 12/1961 | Schweickert et al. | |
| 4,681,652 A | 7/1987 | Rogers et al. | |
| 5,904,981 A | 5/1999 | Oda | |
| 2005/0211167 A1* | 9/2005 | Gunji | C23C 16/44 118/715 |
| 2009/0136408 A1 | 5/2009 | Endoh et al. | |
| 2010/0043972 A1 | 2/2010 | Baldi et al. | |
| 2011/0274926 A1 | 11/2011 | Oda et al. | |
| 2011/0305604 A1 | 12/2011 | Stoecklinger | |

FOREIGN PATENT DOCUMENTS

| | | |
|---|---|---|
| CN | 101476153 A | 7/2009 |
| CN | 102134745 A | 7/2011 |

(Continued)

OTHER PUBLICATIONS

PatBase abstract for JP 59115739, (1984).

(Continued)

*Primary Examiner* — Kenneth A Bratland, Jr.
(74) *Attorney, Agent, or Firm* — Caesar Rivise, PC

(57) ABSTRACT

The invention relates to an apparatus for deposition of polycrystalline silicon, including a reactor chamber with a reactor wall, at least 20 filament rods and gas inlet orifices for reaction gas in the reactor chamber, wherein each filament rod—except for the filament rods close to the reactor wall—has, at a distance of 150 to 450 mm, three further adjacent filament rods and one to three adjacent gas inlet orifices. The invention further relates to a process for depositing polycrystalline silicon on filament rods in such an apparatus, the gas inlet orifices are used to introduce a silicon-containing gas into the reactor chamber and the filament rods are heated to a temperature at which silicon is deposited thereon.

15 Claims, 4 Drawing Sheets

(56) References Cited

FOREIGN PATENT DOCUMENTS

| | | | |
|---|---|---|---|
| CN | 201962075 U | * | 9/2011 |
| CN | 201962075 U | | 9/2011 |
| DE | 19502865 A1 | | 8/1995 |
| DE | 102009003368 B3 | | 3/2010 |
| EP | 0536394 A1 | | 4/1993 |
| GB | 1131462 | | 10/1968 |
| JP | 59115739 A2 | | 7/1984 |
| JP | 2003128492 A | | 5/2003 |
| WO | 2010098319 A1 | | 9/2010 |
| WO | 2011123998 A1 | | 10/2011 |

OTHER PUBLICATIONS

PatBase Abstract for JP 2003128492 A2 (2003).
PatBase Abstract for CN 101476153 A, (2009).
PatBase Abstract for CN 201962075 U, (Mar. 28, 2011).
PatBase abstract for DE 19502865 A1 (1995).

* cited by examiner

A

B

APPARATUS FOR DEPOSITION OF POLYCRYSTALLINE SILICON COMPRISING UNIFORMLY SPACED FILAMENT RODS AND GAS INLET ORIFICES, AND PROCESS FOR DEPOSITION OF POLYCRYSTALLINE SILICON USING SAME

BACKGROUND OF THE INVENTION

High-purity polycrystalline silicon (polysilicon) serves as a starting material for production of monocrystalline silicon for semiconductors by the Czochralski (CZ) or zone melting (FZ) processes, and for production of mono- or polycrystalline silicon by various pulling and casting processes for production of solar cells for photovoltaics.

Polysilicon is typically produced by means of the Siemens process. This involves passing a reaction gas comprising one or more silicon-containing components and optionally hydrogen into a reactor comprising support bodies heated by direct passage of current, silicon being deposited in solid form on the support bodies. The silicon-containing components used are preferably silane (SiH4), monochlorosilane (SiH3Cl), dichlorosilane (SiH2Cl2), trichlorosilane (SiHCl3), tetrachlorosilane (SiCl4) or mixtures of the substances mentioned.

The Siemens process is typically conducted in a deposition reactor (also called "Siemens reactor"). In the most common embodiment, the reactor comprises a metallic base plate and a coolable bell-shaped casing placed onto the base plate so as to form a reaction space within the bell-shaped casing. The base plate is provided with one or more gas inlet orifices and one or more offgas orifices for the departing reaction gases, and with holders which help to hold the support bodies in the reaction space and supply them with electrical current.

Each support body usually consists of two thin filament rods and a bridge which connects generally adjacent rods at their free ends. The filament rods are most commonly manufactured from mono- or polycrystalline silicon; less commonly, metals, alloys or carbon are used. The filament rods are inserted vertically into electrodes present at the reactor base, through which they are connected to the power supply. High-purity polysilicon is deposited on the heated filament rods and the horizontal bridge, as a result of which the diameter thereof increases with time. Once the desired diameter has been attained, the process is ended.

Modern reactors may contain up to 100 filament rods or more. A high number of rods enables high reactor productivity and reduces the specific energy consumption, since the energy losses are reduced, for example, by the radiation to the cold reactor wall.

In prior art reactors, the rods in the reactor are frequently arranged in concentric circles around the center of the base plate. The number of circles depends on how many rods the reactor accommodates.

U.S. Pat. No. 4,681,652 A discloses reactors having 5, 6, 10, 12 and 20 rods, the rods each being positioned in two concentric circles according to the following schemes: 1+4, 2+4, 4+6, 4+8, 8+12 (the first number gives the number of rods in the inner circle, the second number the number of rods in the outer circle).

US 2010/0043972 A1 discloses a reactor having 48 rods, the rods being distributed in three circles: 8+16+24. The bridges connect the rods in pairs within the rod circles, such that the rod pairs or support bodies formed likewise form three concentric circles.

Since the bridge length is small compared to the rod length, the position of the bridges generally does not play any significant role.

Usually, two adjacent rods from a circle are connected by means of a bridge (as in the abovementioned US 2010/0043972 A1).

Also known are designs where some bridges are aligned radially and two rods from the different circles are connected to one another.

U.S. Pat. No. 3,011,877 A describes a reactor in which the rods are inclined and are in contact at their free ends, such that no bridge at all is necessary. Also outlined therein is a means of connecting three rods, the energy being supplied in this case with a three-phase alternating current.

With increasing number of rods, the number of circles on which the rods are arranged generally also increases.

US 2009/0136408 A1 discloses a reactor with 98 rods, the rods being distributed in five circles (6+12+22+26+32).

Gas inlet orifices (for the injection of the fresh reaction gas) are usually positioned in the middle of the reactor (i.e. within the inner rod circle) and/or between the rod circles.

Offgas orifices are generally likewise provided in the middle of the reactor (i.e. within the inner rod circle) and/or between the outer rod circle and the reactor wall.

Also known are designs in which the offgas leaves the reactor via orifices in the upper reactor section.

Sometimes, cooling elements are introduced into the reactor space. They serve to reduce the gas space temperature and may be configured and positioned in different ways.

In general, such cooling elements are designed as cooled shields around rods and/or bridges such that the rods are encapsulated thereby (see, for example, EP 0 536 394 A1).

Also known are embodiments with a cooling finger inserted into the reactor from above (DE 195 02 865 A1) or with a cooled tube introduced in the middle (DE 10 2009 003 368 B3), which is designed as an extension of an offgas orifice.

In some cases, a stationary heating element which is inserted only for ignition of the filament rods is present in the reactor space. Such a heating element, in the case of reactors with several rod circles, is usually in the middle of the reactor, i.e. is positioned within the innermost rod circle (see, for example, US 2009/0136408 A1 or GB 1131462 A).

In the production of thick polycrystalline silicon rods (with diameter >100 mm) in the prior art Siemens reactor, it is a relatively frequent observation that the rods have regions with a very rough surface ("popcorn"). These rough regions have to be removed from the rest of the material and be sold at much lower prices than the rest of the silicon rod.

FIG. 5 shows regions of silicon rods with a smooth surface (FIG. 5 A) and with a popcorn surface (FIG. 5 B).

By adjusting the process parameters (for example reducing the temperature of the rods), the proportion of the popcorn material can be reduced (see U.S. Pat. No. 5,904,981 A1).

Such changes, however, lead to the effect that the process runs more slowly and hence the yield is reduced, which worsens the economic viability.

The object was therefore that of producing polycrystalline rods from high-purity silicon with a low proportion of rough surfaces in a more economically viable manner.

This object is achieved by the present invention.

DESCRIPTION OF THE INVENTION

The invention is based on positioning of filament rods and gas inlet orifices in the reactor differently than in the prior art.

It has been found that the proportion of rough surfaces ("popcorn") is surprisingly thus reduced significantly with otherwise identical process conditions.

It is thus possible, compared to the prior art, with the same rod quality, to run much faster deposition processes which improve economic viability.

The object of the invention is achieved by an apparatus for deposition of polycrystalline silicon, comprising a reactor chamber with a reactor wall, at least 20 filament rods and gas inlet orifices for reaction gas in the reactor chamber, wherein each filament rod—except for the filament rods close to the reactor wall—has, at a distance of 150 to 450 mm, three further adjacent filament rods and one to three adjacent gas inlet orifices.

Preferably, each filament rod—except for the filament rods close to the reactor wall—has, at a distance of 250 to 350 mm, three further filament rods and one to three gas inlet orifices.

Preferably, a difference in the distances of any filament rod from the individual adjacent filament rods and the gas inlet orifices is less than 50%, more preferably less than 25% and most preferably less than 10%.

Preferably, an angle between the directions from any filament rod to its adjacent filament rods and to its adjacent gas inlet orifices is 90-150°, preferably 105-135° and most preferably 115-125°.

Preferably, a length of the filament rods is 5 to 15 times, preferably 8 to 12 times, a distance between adjacent rods.

Preferably, the gas inlet orifices are nozzles which are directed vertically upward with respect to a base plate of the reactor chamber.

Preferably, the gas inlet orifices each have a cross-sectional area of 1 to 10 000 mm².

Preferably, the reactor chamber has a round cross section or a cross section matched to the number of filament rods and optimal space utilization, for example a hexagonal cross section.

Preferably, a further characteristic feature of the inventive apparatus is that at least one gas inlet orifice central with respect to a cross section of the reactor chamber is provided, with one or more offgas orifices positioned next to and around that at least one central gas inlet orifice and/or between reactor wall and the filament rods close to the reactor wall.

Preferably, it is an additional feature of the inventive apparatus that one or more cooling bodies and/or one or more heating elements are present in the reactor chamber, these being arranged above gas inlet orifices or being positioned in the reactor chamber in place of gas inlet orifices.

The object of the invention is also achieved by a process for deposition of polycrystalline silicon on filament rods in an aforementioned apparatus, wherein the gas inlet orifices are used to introduce a silicon-containing gas into the reactor chamber and the filament rods are heated to a temperature at which silicon is deposited thereon.

The filament rods are preferably thin silicon rods, often also called thin rods, and for the sake of simplicity are referred to hereinafter as silicon rods.

The inventive reactor comprises at least 20 silicon rods of this kind, on which polycrystalline silicon is deposited during the Siemens process, and gas inlet orifices, for example input gas nozzles, in order to introduce silicon-containing reaction gas into the reactor.

It is essential to the success of the invention that filament rods and input gas nozzles are arranged as follows:

Each silicon rod (excluding rods beside the reactor wall) must have, at a distance of 150 to 450 mm, three further silicon rods and one to three input gas nozzles. Those three further silicon rods are referred to as adjacent rods or neighbor rods.

Preferably, the distance from nozzles and neighbor rods is between 200 and 350 mm.

The individual distances between the adjacent silicon rods or nozzles may differ, but are preferably between 150 and 450 mm, more preferably between 200 and 350 mm.

Preferably, a difference in the distances from the individual adjacent silicon rods and nozzles is less than 50%, more preferably less than 25% and most preferably less than 10%.

The silicon rods beside the reactor wall have, at the same distance, only 1 to 3 further silicon rods and 1 to 3 gas inlet orifices.

The angles between the directions from silicon rod to the neighbor rods and from the silicon rod to the neighbor nozzles are preferably between 90 and 150°, more preferably between 105 and 135°, most preferably 115-125°.

A length of the silicon rods is preferably 5 to 15 times, preferably 8 to 12 times, the distance between adjacent rods.

The nozzles are preferably aligned vertically upward.

The nozzles preferably each have a cross-sectional area of 1 to 10 000 mm².

The nozzles more preferably have a round cross section and a diameter between 3 and 100 mm.

In addition to the nozzles directed upward, additional nozzles directed downward or laterally in the upper reactor section are likewise preferred.

The reactor itself may have a round cross section or one matched to the circumference of the silicon rods, for example a hexagonal cross section.

One or more offgas orifices are preferably positioned in the middle of the reactor around the central nozzles or beside the central nozzles, and/or between reactor wall and the outer silicon rods.

When one or more cooling bodies are introduced into the reactor, they can be positioned above or in place of one or more nozzles.

When one or more heating elements are introduced into the reactor, they can be positioned above or in place of one or more nozzles.

When polycrystalline silicon rods are produced in such inventive deposition reactors, they have significantly less popcorn.

In the case of homogeneous rod quality, it is possible (for example due to higher temperature of the silicon rods) to run much faster and thus more economically viable deposition processes.

BRIEF DESCRIPTION OF THE FIGURES

The invention is illustrated hereinafter by FIG. 1-4.

LIST OF REFERENCE NUMERALS USED

1 Filament or silicon rods
2 Gas inlet orifices
3 Reactor walls

Figure 1:
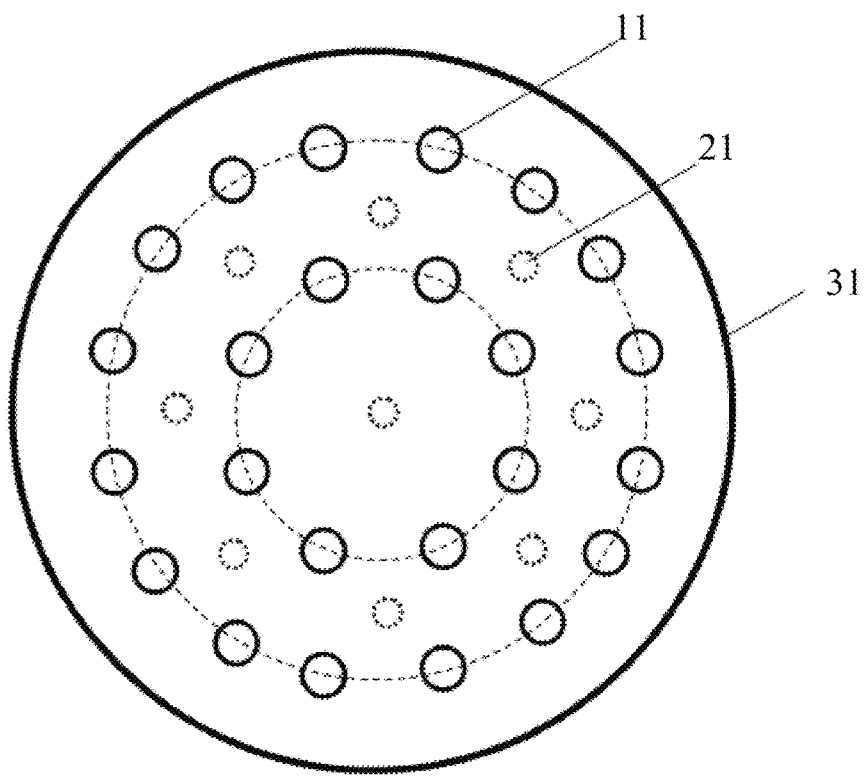
FIG. 1 shows a schematic cross section of a reactor with rods and gas inlet orifices.

FIG. 1 shows the schematic structure of a conventional Siemens reactor with 24 silicon rods 11, gas inlet orifices 21 and reactor wall 31.

Broken lines show circles on which the silicon rods are arranged.

Figure 2:
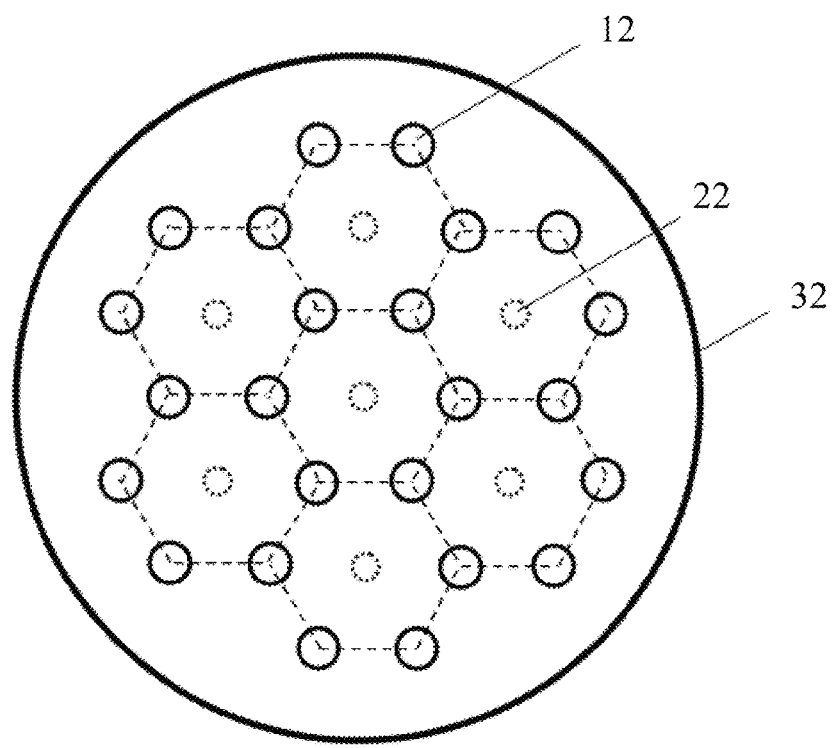
FIG. 2 shows a schematic cross section of a reactor with rods and gas inlet orifices.

FIG. 2 shows a schematic diagram of an inventive reactor with 24 silicon rods 12, gas inlet orifices 22 and reactor wall 32.

Broken lines connect each silicon rod 12 to three adjacent rods 12.

Exceptions here are formed by the silicon rod 12 next to the reactor wall 32, which have only two further rods 12 in their immediate environment.

Figure 3:
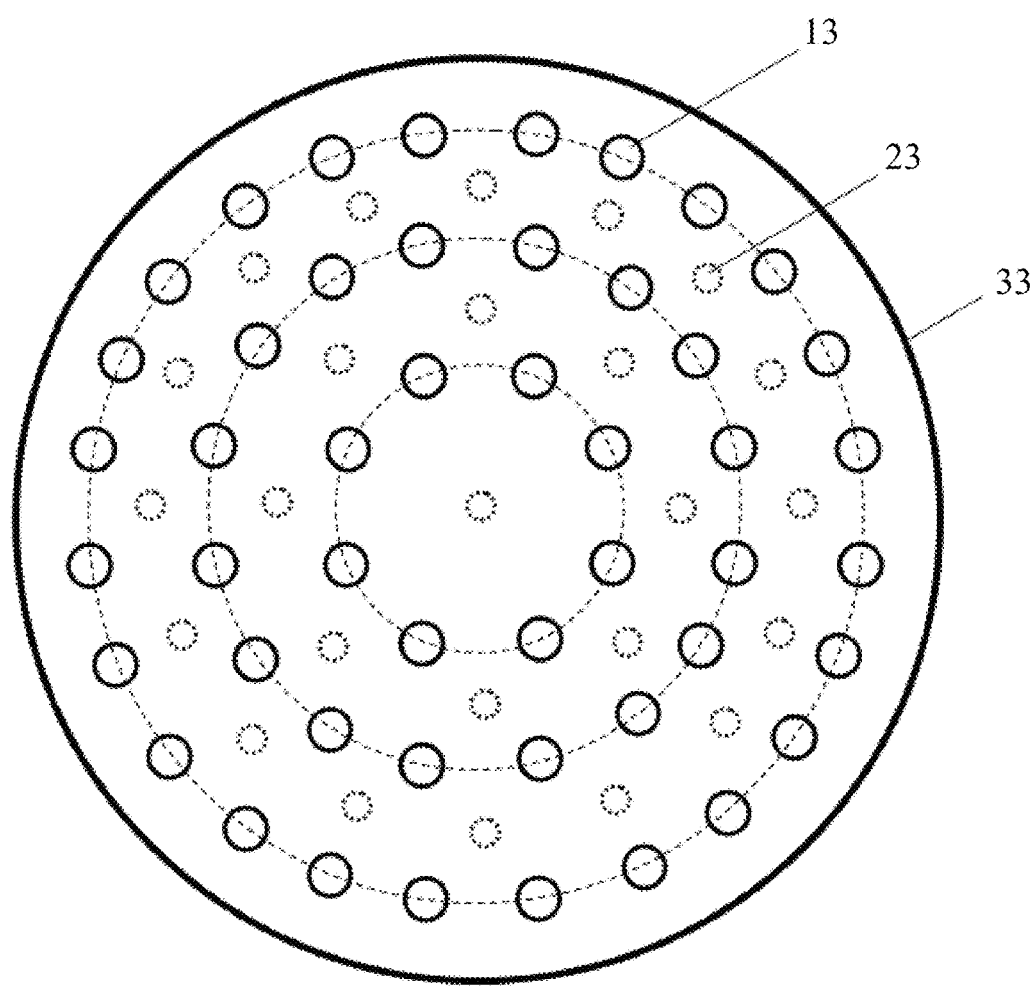
FIG. 3 shows a schematic cross section of a reactor with rods and gas inlet orifices.

FIG. 3 shows a Siemens reactor with 48 silicon rods 13, gas inlet orifices 23, and reactor wall 33, according to the prior art. Broken lines show circles on which the silicon rods 13 are distributed.

Figure 4:
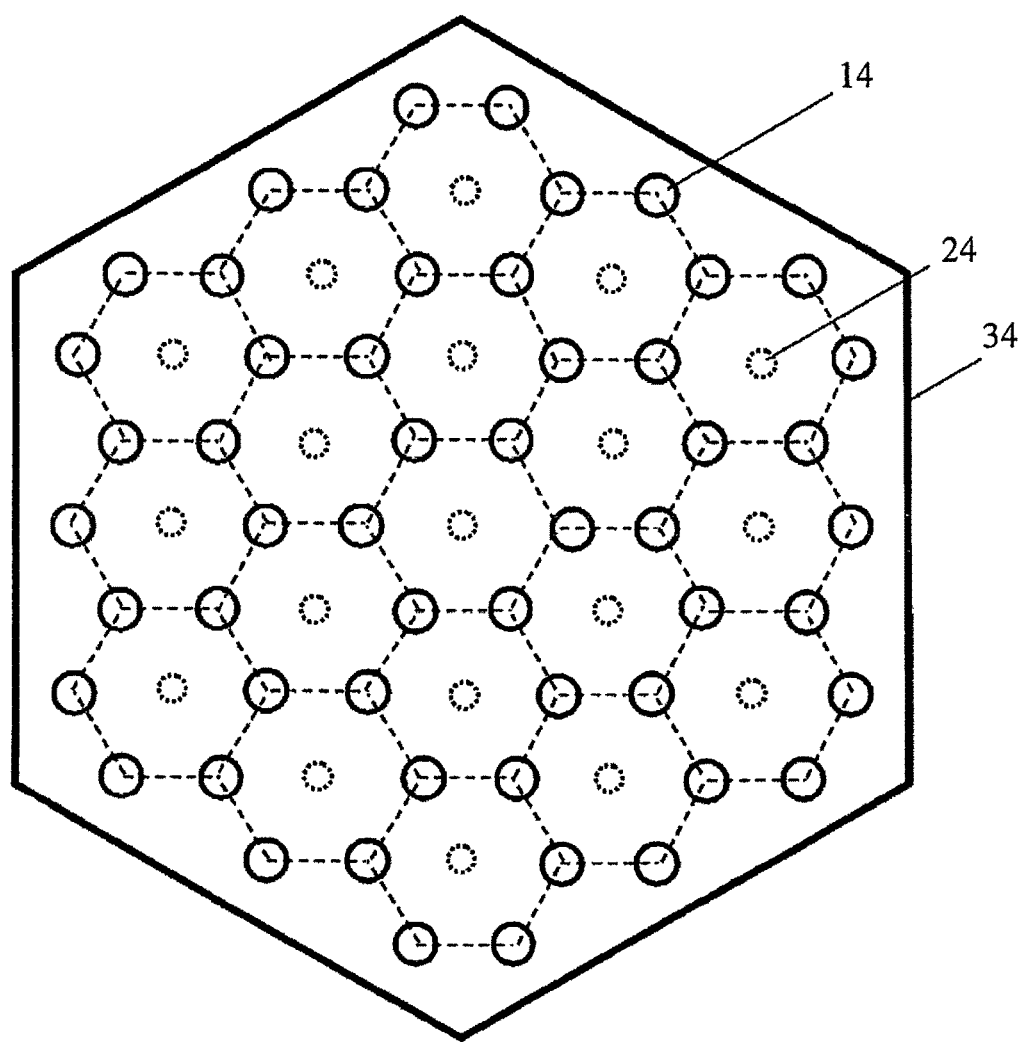
FIG. 4 shows a schematic cross section of a reactor with rods and gas inlet orifices.

FIG. 4 shows a schematic diagram of an inventive reactor with silicon rods 14, gas inlet orifices 24 and reactor wall 34. Broken lines connect each silicon rod 14 to three adjacent rods 14. Exceptions here are formed by the silicon rods 14 beside the reactor wall 34, which have only two further rods 14 in their immediate environment. A reactor with hexagonal cross section is shown here. A round cross section as in FIG. 2 is likewise possible and preferred.

EXAMPLES AND COMPARATIVE EXAMPLES

The same deposition process was run in Siemens reactors with different arrangement of the rods:

The reaction gas consisted in each case of trichlorosilane (TCS) and hydrogen, with a constant TCS content at 20 mol %.

The gas supply during the deposition was regulated in each case such that the TCS flow was 0.5 kmol per 1 m² of rod surface area and per 1 hour.

The temperature of the rods was in each case regulated such that the diameter of the rods increased at a uniform rate of 1 mm per h.

Figure 5:
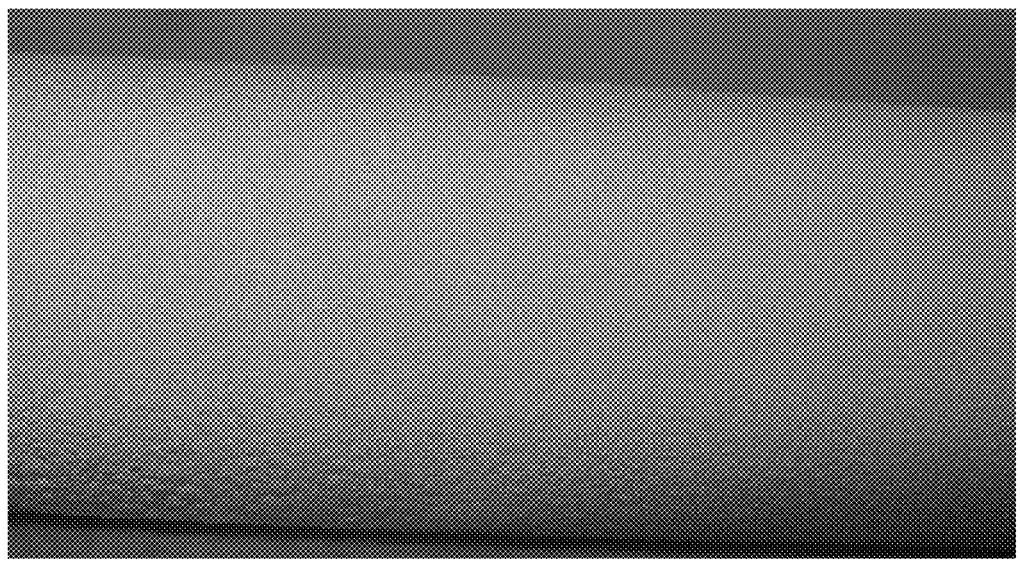
FIG. 5 shows regions of silicon rods with a smooth surface, FIG. 5 A and with a popcorn surface, FIG. 5 B.
Figure 5:
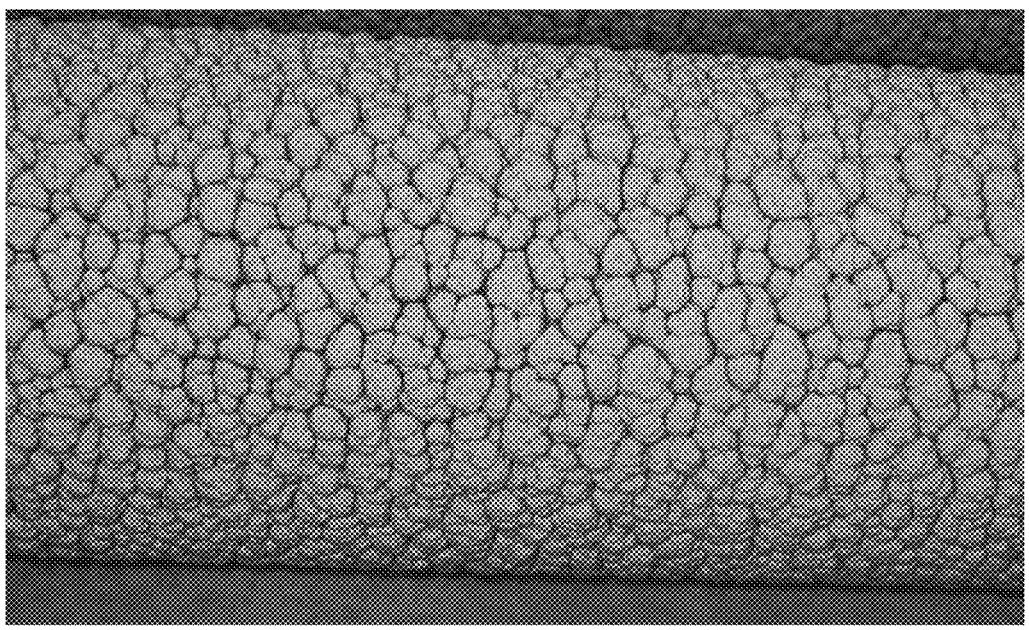

After deinstallation, the proportion of rough surface area (popcorn) on the rods was measured. This involved wrapping Si rods with a transparent film and marking the regions with a popcorn surface (as in FIG. 5B). Subsequently, the marked film surface area was measured and, based on the total area of the rod, converted to the proportion of popcorn surface. Since the transition between the smooth and popcorn surface is not always very sharp, the numbers obtained are not very precise. However, they give a reliable qualitative comparison between the reactor types tested.

Comparative Example 1

In this example, the above-described process was run in a conventional Siemens reactor (internal diameter 1500 mm) with 24 rods (each 2.5 m in length).

These were in 2 circles: 8 rods in the 1st circle with diameter 500 mm and 16 rods in the 2nd circle with diameter 1000 mm (cf. FIG. 1).

Within the circles, the rods were distributed homogeneously.

The input gas nozzles were in the middle of the reactor (1 nozzle) and between the rod circles (8 nozzles).

The deposition was effected up to a rod diameter of 150 mm.

On average, the proportion of rough surface area in this case was 15%.

Example 1

In the second example, the same deposition process was run in an inventive reactor (cf. FIG. 2).

The reactor (internal diameter 1500 mm) had 24 rods (each 2.5 m) and 7 nozzles.

The distances between the adjacent rods and the distances from the rod to the closest nozzles were all the same and were 220 mm.

The result was thus the same angle of 120° between the directions from the rod to the neighbor rods and from the rod to the neighbor nozzles.

In this case, the rough surface area (Popcorn) on the rods deposited to 150 mm made up a proportion of only about 5%.

Comparative Example 2

In this example, the above-described process was run in a conventional Siemens reactor (internal diameter 2000 mm) with 48 rods (each 2.5 m in length).

These formed 3 circles: 8 rods in the 1st circle with diameter 500 mm, 16 rods in the 2nd circle, diameter 1000 mm, and 24 rods in the 3rd circle with diameter 1500 mm (cf. FIG. 3).

Within these circles, the rods were distributed homogeneously. The input gas nozzles are in the middle of the reactor (1 nozzle), between the inner and the middle rod circles (8 nozzles) and between the middle and outer rod circles (16 nozzles).

The deposition was likewise effected up to a rod diameter of 150 mm.

The proportion of popcorn on the deposited rods in this case averaged 20%.

Example 2

In this example, an inventive reactor with 54 rods (each 2.5 m), a hexagonal cross section (inner side length 1000 mm) and 19 gas inlet orifices (nozzles) was used (cf. FIG. 4).

The distances between the adjacent rods and the distances from the rod to the closest nozzles were all the same and were 220 mm.

The result was thus the same angle of 120° between the directions from the rod to the neighbor rods and from the rod to the neighbor nozzles.

In this case, the proportion of popcorn on the rods deposited to 150 mm averaged only about 5%.

What is claimed is:

1. An apparatus for deposition of polycrystalline silicon, comprising a reactor chamber with a reactor wall, at least 20 filament rods and gas inlet orifices for reaction gas in the reactor chamber, wherein the filament rods are hexagonally arranged and each filament rod—except for the filament rods close to the reactor wall—has, at a distance of 150 to 450 mm, three further adjacent filament rods and one to three adjacent gas inlet orifices, and wherein the reactor chamber has a hexagonal cross-section matched to the number of filament rod.

2. The apparatus as claimed in claim 1, wherein each filament rod—except for the filament rods close to the reactor wall—has, at a distance of 250 to 350 mm, three further adjacent filament rods and one to three adjacent gas inlet orifices.

3. The apparatus as claimed in claim 1, wherein a difference in distances of any filament rod from the three further adjacent filament rods and the adjacent gas inlet orifices is less than 50%.

4. The apparatus as claimed in claim 1, wherein a difference in distances of any filament rod from the three further adjacent filament rods and the adjacent gas inlet orifices is less than 25%.

5. The apparatus as claimed in claim 1, wherein a difference in distances of any filament rod from the three further adjacent filament rods and the adjacent gas inlet orifices is less than 10%.

6. The apparatus as claimed in claim 1, wherein an angle between directions from any filament rod to its three further adjacent filament rods and to its adjacent gas inlet orifices is 90-150°.

7. The apparatus as claimed in claim 1, wherein an angle between directions from any filament rod to its three further adjacent filament rods and to its adjacent gas inlet orifices is 105-135°.

8. The apparatus as claimed in claim 1, wherein an angle between directions from any filament rod to its three further adjacent filament rods and to its adjacent gas inlet orifices is 115-125°.

9. The apparatus as claimed in claim 1, wherein a length of the filament rods is 5 to 15 times a distance between adjacent rods.

10. The apparatus as claimed in claim 1, wherein a length of the filament rods is 8 to 12 times a distance between adjacent rods.

11. The apparatus as claimed in claim 1, wherein the gas inlet orifices are nozzles which are directed vertically upward with respect to a base plate of the reactor chamber.

12. The apparatus as claimed in claim 1, wherein the gas inlet orifices have a cross-sectional area of 1 to 10,000 $mm^2$.

13. The apparatus as claimed in claim 1, wherein at least one gas inlet orifice central with respect to a cross-section of the reactor chamber is provided, with one or more offgas orifices positioned next to and around that at least one central gas inlet orifice and/or between the reactor wall and the filament rods close to the reactor wall.

14. The apparatus as claimed in claim 1, wherein one or more cooling bodies and/or one or more heating elements are present in the reactor chamber, these being arranged above gas inlet orifices or being positioned in the reactor chamber in place of gas inlet orifices.

15. A process for depositing polycrystalline silicon on filament rods in an apparatus as claimed in claim 1, wherein the gas inlet orifices are used to introduce a silicon-containing gas into the reactor chamber and the filament rods are heated to a temperature at which silicon is deposited thereon.

\* \* \* \* \*